(12) United States Patent
Tandon et al.

(10) Patent No.: US 7,994,418 B2
(45) Date of Patent: Aug. 9, 2011

(54) MONOLITHICALLY CONNECTED PHOTOVOLTAIC DEVICES ON FLEXIBLE SUBSTRATES

(75) Inventors: Sheila Neumann Tandon, Niskayuna, NY (US); Bastiaan Arie Korevaar, Schenectady, NY (US); Svetlana Rogojevic, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 299 days.

(21) Appl. No.: 12/284,132

(22) Filed: Sep. 18, 2008

(65) Prior Publication Data

US 2010/0065099 A1    Mar. 18, 2010

(51) Int. Cl.
*H01L 31/05* (2006.01)

(52) U.S. Cl. ........ 136/249; 136/244; 136/256; 136/258; 438/80

(58) Field of Classification Search ............ 136/249
See application file for complete search history.

(56) References Cited

U.S. PATENT DOCUMENTS

| | | | |
|---|---|---|---|
| 5,131,954 A | 7/1992 | Vogeli et al. | 136/244 |
| 5,385,848 A | 1/1995 | Grimmer | 437/2 |
| 6,080,928 A * | 6/2000 | Nakagawa | 136/249 |
| 6,455,347 B1 | 9/2002 | Hiraishi et al. | 438/80 |
| 6,521,823 B2 | 2/2003 | Kubota et al. | 136/246 |
| 6,559,411 B2 * | 5/2003 | Borgeson et al. | 219/121.69 |
| 6,690,041 B2 | 2/2004 | Armstrong et al. | 257/184 |
| 7,095,090 B2 | 8/2006 | Nakajima et al. | 257/433 |
| 7,259,321 B2 | 8/2007 | Oswald et al. | 136/244 |
| 7,276,658 B2 | 10/2007 | Dubbeldam | 136/256 |
| 7,638,707 B2 * | 12/2009 | Shinohara | 136/244 |
| 2003/0230338 A1 * | 12/2003 | Menezes | 136/265 |
| 2007/0079866 A1 | 4/2007 | Borden et al. | 136/252 |
| 2008/0236662 A1 * | 10/2008 | Ichikawa et al. | 136/256 |

* cited by examiner

*Primary Examiner* — Jeffrey T Barton
*Assistant Examiner* — Jayne Mershon
(74) *Attorney, Agent, or Firm* — Ann M. Agosti

(57) ABSTRACT

A method of monolithically interconnecting electrical devices that isolates and interconnects the contacts of neighboring electrical devices such as thin film PV cells, without damaging the surrounding materials.

11 Claims, 2 Drawing Sheets

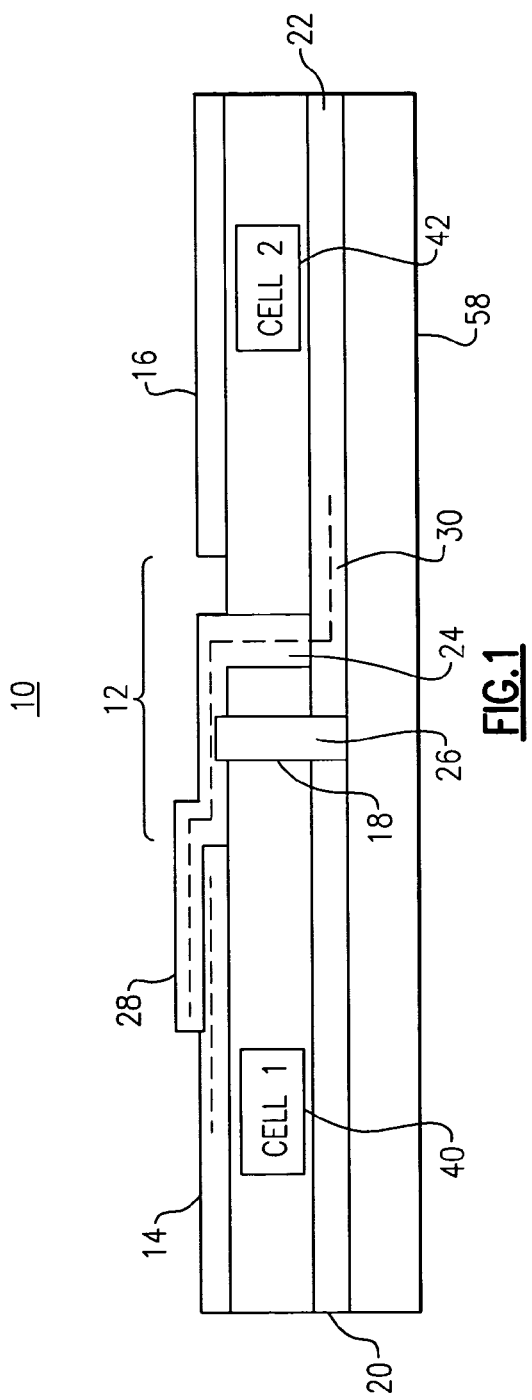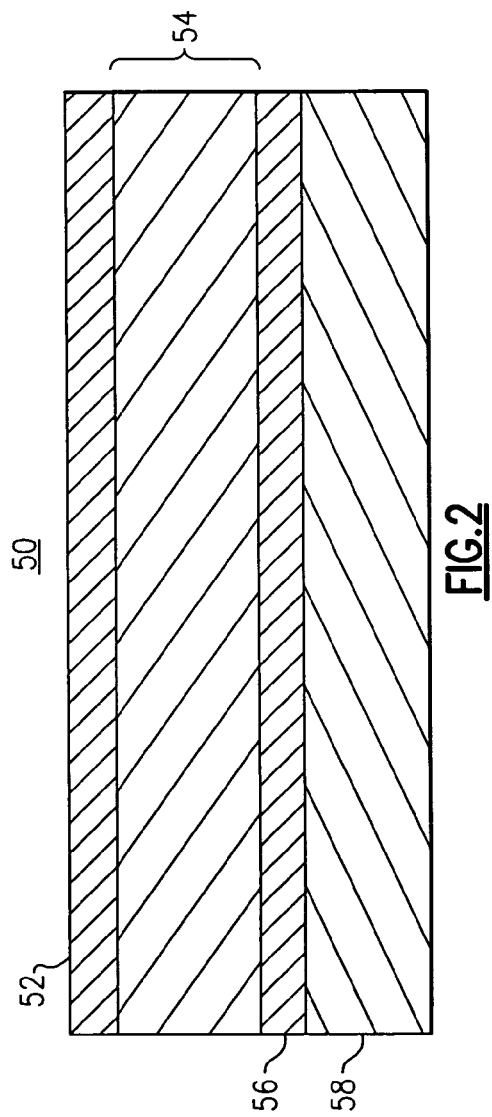

MONOLITHICALLY CONNECTED PHOTOVOLTAIC DEVICES ON FLEXIBLE SUBSTRATES

BACKGROUND

The invention relates generally to monolithic devices and more particularly to a method of monolithically interconnecting electrical devices such as photovoltaic (PV) cells on substrates including flexible substrates.

PV cells need to be electrically connected via an interconnection process in order for individual PV cells to be fabricated into modules. The conventional interconnection approach involves connecting discrete cells together via shingling or metallic ribbons. In the conventional approach, interconnected cells do not maintain a common substrate.

Monolithic integration refers to the process of interconnecting cells as part of the cell fabrication process. Monolithic integration typically is implemented for thin film PV modules where PV layers are deposited over large area substrates. Scribe and pattern steps are often used to divide the large area into electrically interconnected cells while maintaining a common substrate. This approach is typically applied to solar cells that are deposited on glass.

Several approaches exist for implementing monolithic integration; and each approach has various advantages and disadvantages related to the fabrication sequence, required tools, and material interactions, among other things.

One of the greatest challenges in thin film PV fabrication relates to the need to isolate the top contacts of neighboring cells, i.e., scribe through the top conducting outer layer without damaging the underlying layers. Three scribes are typically necessary to form a monolithic interconnect. The spacing between scribes should be wide enough to overcome the possibility of unwanted electrical connections. The total area occupied by the scribes plus any space between scribes should ideally be as small as possible to maximize the absorbing area of the PV cell. Mechanical scribing is not practical for flexible substrates; and laser scribing is challenging if the underlying layers are more highly absorbing than the overlying layer (in the case of CIS cells, the transparent conductive oxide (TCO) layer).

Thin film PV modules are implemented by dividing the module into individual cells that are series connected to provide a high voltage output. A conventional monolithic PV cell interconnect process employs a sequence of steps such as shown in FIG. 3. The process begins by depositing a first conducting layer 60 on a substrate 62. The first conducting layer 60 is scribed using a linear cut 64 across the module. A semiconductor layer 66 such as a CIGS layer is then deposited as depicted in FIG. 3. A second scribe 68 parallel to the first scribe 64 isolates the CIGS layer 66 into individual PV cells. A second conducting layer 70 that may be a transparent conductive oxide (TCO) is then deposited as also depicted in FIG. 3. The process is completed with a third scribe 72 to form the series connection 74 in which the TCO from the second conducting layer 70 connects the top of one cell 76 to the bottom of the next cell 78.

In view of the above, it would be both advantageous and beneficial to provide a method of monolithically interconnecting electrical devices such as PV cells on a common flexible substrate while avoiding the challenges associated with known monolithic integration techniques.

BRIEF DESCRIPTION

Briefly, in accordance with one embodiment, a monolithic module comprises:

a first conducting layer covering at least one semiconductor layer covering a second conducting layer covering a substrate;

a first trench penetrating through the first conducting layer to separate a first conducting layer for a first electrical device from a first conducting layer for a second electrical device;

a second trench penetrating through the at least one semiconductor layer and the second conducting layer to separate a second conducting layer for the first electrical device and a second conducting layer for the second electrical device, wherein the second trench is at least partially filled with a resistive material;

a third trench penetrating through the at least one semiconductor layer; and an electrically conductive interconnecting material at least partially filling the third trench and providing an electrical current pathway from the first electrical device first conducting layer to the second electrical device second conducting layer.

A method of monolithically interconnecting electrical devices, the method comprising:

providing a first conducting layer covering at least one semiconductor layer covering a second conducting layer covering a substrate;

forming a first trench penetrating through at least the first conducting layer;

forming a second trench such that the second trench penetrates through at least one semiconductor layer and the second conducting layer;

forming a third trench such that the third trench penetrates through at least one semiconductor layer;

at least partially filling the first trench with a resistive material;

at least partially filling the third trench with an electrically conductive material such that it provides an electrical current pathway from the first electrical device first conducting layer to the second electrical device second conducting layer;

at least the second or third trenches are within the boundaries of the first trench.

DRAWINGS

These and other features, aspects, and advantages of the present invention will become better understood when the following detailed description is read with reference to the accompanying drawings in which like characters represent like parts throughout the drawings, wherein:

FIG. 1 is a diagram illustrating one cross sectional area of a monolithically integrated module according to one embodiment of the invention;

FIG. 2 is a diagram illustrating one cross sectional area of an electrical device suitable to implement the monolithic module shown in FIG. 1.

Figure 3:
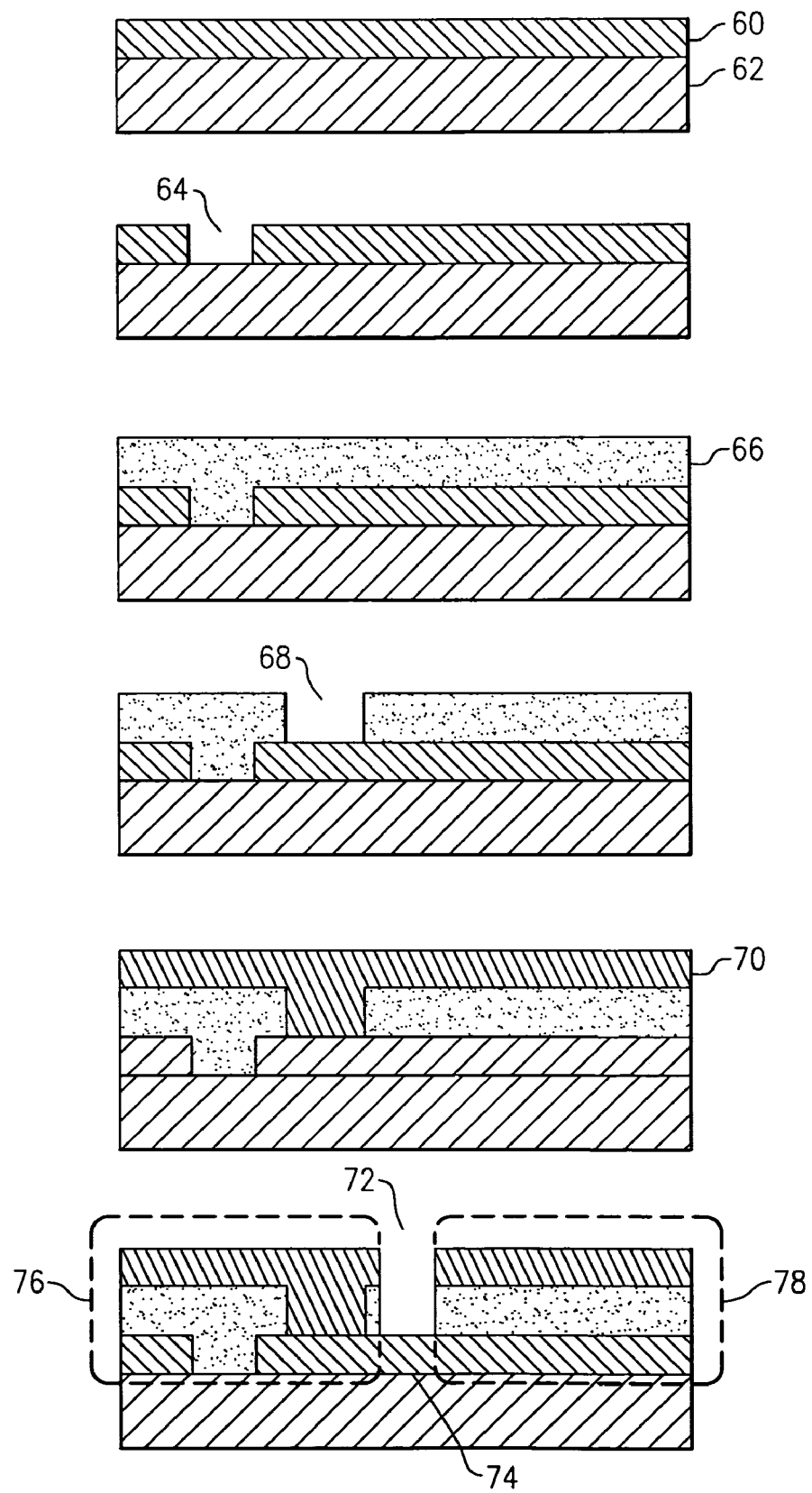
FIG. 3 illustrates a conventional interconnect process for a monolithically integrated module that is known in the art.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

The conventional interconnection approach for flexible devices to fabricating modules from individual electrical devices involves connecting discrete electrical devices together via shingling or metallic ribbons. Monolithic interconnection is the conventional approach on glass. Monolithic integration refers to the process of interconnecting the individual electrical devices together as part of the module fabrication process. Typically, monolithic integration is implemented for thin film PV modules where PV layers are deposited over large area substrates. Scribe and pattern steps are often used to divide the large area into electrically interconnected cells, as stated above, without dividing the substrate.

Although numerous approaches exist for implementing monolithic integration, each approach has its own set of advantages and disadvantages relating to, without limitation, the fabrication sequence, required tools, and interactions of materials. Keeping the foregoing in mind, an approach to monolithically connecting electrical devices such as PV cells that overcomes many of the disadvantages with known monolithic integration processes and devices is now described below with reference to the figures.

Looking now at FIG. 1, one cross section of a pair of monolithically interconnected electrical devices 10 is illustrated according to one embodiment of the invention. Although the invention is not so limited, the process described below with reference to FIG. 1 is particularly useful for connecting copper indium gallium diselenide (CIGS) cells on flexible substrates or cells based on similar material systems. Other suitable semiconductor materials may include, without limitation, CdS, CdTe, amorphous silicon, Cu(In,Ga,Al)(S,Se)2, and micro-crystalline silicon. Suitable applications can include, without limitation, solar device applications and advanced OLED interconnection schemes in addition to improved fabrication or interconnection of low-cost or flexible electronics, optical devices, MEMS, microfluidics, medical, bio-sciences, sensing, or security devices and their combinations.

With continued reference to FIG. 1, the monolithically interconnected electrical devices 10 are formulated from a single device 50 such as depicted in FIG. 2 that includes a first conducting layer 52 covering one or more semiconductor layers 54 covering a second conducting layer 56 covering a substrate 58. The first conducting layer 52 may be a transparent conductive oxide such as, without limitation, doped versions of indium oxide, zinc oxide, or tin oxide. Other exemplary materials may include, without limitation, Al, Mo, SnO, CdSnO4, ZnSnO4, GaZnO, BZO, AZO, etc. Semiconductor layer(s) 54 may comprise, without limitation, CdS, CdTe, amorphous silicon, Cu(In,Ga,Al)(S,Se)2, micro-crystalline silicon, ZnS, or MgO. The second conducting layer 56 may comprise, without limitation, Al, Mo, ITO, ZnO, SnO, Cu, Au, Ag, etc. The semiconductor layer(s) 54 comprise copper indium gallium diselenide (CIGS) according to one aspect of the invention. The substrate 58 is a flexible substrate according to another aspect of the invention. The device structure for devices 10 shown in FIG. 1 is particularly useful for connecting CIGS cells on a flexible substrate, as stated above.

Monolithically interconnected electrical devices 10 are formulated by first forming a first trench 12 penetrating through at least the first conducting layer 52 to provide a first conducting layer 14 for a first electrical device 40 and a different first conducting layer 16 for a second electrical device 42. The first trench 12 may have a width between about 2 µm and about 300 µm, according to one aspect of the invention. A second trench 18 is formed within the first trench 12 such that the second trench 18 penetrates through the at least one semiconductor layer 54 and the second conducting layer 56 to provide a second conducting layer 20 for the first electrical device 40 and a different second conducting layer 22 for the second electrical device 42. The width of the second trench 18 is smaller than the width of the first trench 12. The second trench 12 may have a width between about 1 µm and about 100 µm, according to one aspect of the invention. A third trench 24 is also formed within the first trench 12 in proximity to the second trench 18, such that the third trench 24 penetrates through the at least one semiconductor layer 54. The second trench 18 and the third trench 24 can be formed in any order. The width of the third trench 24 is smaller than the width of the first trench 12, and may have a width between about 1 µm and about 100 µm, according to one aspect of the invention. Spacing between the second trench 18 and the third trench 24 may lie in a range between about 0 µm and 100 µm.

The second trench 18 is filled with a resistive material 26 having a resistivity greater than about 10 Ohm-cm according to one aspect of the invention; and an electrically conductive interconnecting material 28 having a resistivity of less than about $10^{-3}$ Ohm-cm according to one aspect of the invention, fills the third trench 24 and provides an electrical current pathway 30 from the first electrical device first conducting layer 14 to the second electrical device second conducting layer 22. The electrically conductive interconnecting material 28 is patterned in such a way that it does not electrically connect the first conducting layers of neighboring electrical devices or cells. Suitable conductive polymers that may be used to provide the electrically conductive interconnecting material 28 may include, without limitation, polyaniline, polyacetylene, poly-3,4-ethylene dioxy thiophene (PEDOT), poly-3,4-propylene dioxythiophene (PProDOT), polystyrene sulfonate (PSS), polyvinyl carbazole (PVK), organometallic precursors, dispersions or carbon nanotubes, etc.

At least one of the trenches are at least partially filled by a liquid despense method such as, without limitation, ink-jet printing, screen printing, flexo printing, gravure printing, aerosol dispense, extrusion, syringe dispense, or any combination thereof.

Each device 40, 42 comprises a CIGS PV cell according to one aspect of the invention; while substrate 58 is a flexible substrate according to another aspect of the invention.

The monolithically interconnected electrical devices 10 advantageously can employ an interconnect material 28 that is different from that used to formulate the other device layers according to one aspect of the invention. Further, the process used to formulate the monolithically interconnected electrical devices 10 allows formation of trenches 12, 18, 24 after all device layers have been already deposited. The first conducting layer trench 12 also advantageously is used to make deeper trenches 18, 24 into the other device layers.

In summary explanation, a method of monolithically interconnecting electrical devices such as photovoltaic (PV) cells on a common substrate that may be a flexible substrate, has been described for fabricating a monolithically integrated module. The structure may avoid mechanical scribe steps, providing an advantage over known processing techniques for low cost flexible substrates. Since the interconnect processing can be implemented in one step after all device layers are deposited, the number of cleaning steps may be reduced, increasing the quality of device interfaces. Further, the interconnect area required for scribing can be reduced, thus providing a larger effective cell area to reduce the difference between individual device (cell) and module efficiency.

Those skilled in the monolithic device and related arts will readily understand the principles described above apply equally well to more complex structures including, without limitation, a full copper indium gallium diselenide (CIGS) device with p-n junctions and insulating intrinsic ZnO layers between the TCO and the window layers or other layers that may be included. Some other exemplary thin film semiconductor materials suitable for implementing PV modules and devices include hydrogenated amorphous silicon (a-Si:H) and cadmium telluride (CdTe), wherein for example, a-Si:H is used to make p-i-n homojunction cells and CdTe is used with CdS to make CdTe/CdS heterojunction cells.

Looking again at FIG. 2, some embodiments of second conducting layer 56 may comprise, for example, Al, Mo, ITO, ZnO, SnO Cu, Au, Ag, etc., while first conducting layer 52 may comprise, for example, tin oxide, indium oxide, indium tin oxide, zinc oxide (ZnO), or combinations thereof to provide transparent contacts in PV cells. Conducting layer 52 thus is transparent to portions of the light spectrum which are significantly absorbed by semiconductor material layer(s) 54.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A monolithic module comprising:
  a first conducting layer abutting and covering at least one semiconductor layer abutting and covering a second conducting layer abutting and covering a substrate;
  a first trench penetrating through the first conducting layer to separate a first conducting layer for a first electrical device from a first conducting layer for a second electrical device;
  a second trench penetrating solely through the at least one semiconductor layer and the second conducting layer to separate a second conducting layer for the first electrical device and a second conducting layer for the second electrical device, wherein the second trench is at least partially filled with a resistive material;
  a third trench penetrating solely through the at least one semiconductor layer; and
  an electrically conductive interconnecting material at least partially filling the third trench and providing an electrical current pathway from the first electrical device first conducting layer to the second electrical device second conducting layer,
  wherein the second trench and third trench are within the boundaries of the first trench, and further wherein the second trench is spaced apart from and occupies an area that is different from the area occupied by the third trench.

2. The monolithic module according to claim 1, wherein both the second and third trenches are within the boundaries of the first trench.

3. The monolithic module according to claim 1, wherein the substrate is a flexible substrate.

4. The monolithic module according to claim 1, wherein the substrate is a glass or another non-conductive rigid substrate.

5. The monolithic module according to claim 1, wherein the first and second electrical devices are configured as a photovoltaic (PV) module.

6. The monolithic module according to claim 1, wherein the first and second electrical devices comprise photovoltaic (PV) cells configured as a module.

7. The monolithic module according to claim 6, wherein at least one PV cell is a multijunction cell.

8. The monolithic module according to claim 1, wherein the semiconductor layers of first electrical device and the second electrical device each comprise at least one of Cu(In,Ga,Al)(Se,S)2 materials, CdTe, amorphous silicon, microcrystalline silicon, cadmium sulfide, zinc sulfide, or ZnMgO.

9. The monolithic module according to claim 1, wherein the first trench is wider than the second trench and the third trench.

10. The monolithic module according to claim 1, wherein the electrically conductive interconnecting material is different from other layer materials associated with the monolithically interconnected electrical devices.

11. The monolithic module according to claim 10, wherein the conductive material comprises at least one of silver, gold, transparent conductive oxide materials, or conductive polymers.

* * * * *